United States Patent [19]
Pomper et al.

[11] Patent Number: 5,018,103
[45] Date of Patent: May 21, 1991

[54] READ-ONLY MEMORY FOR A GATE ARRAY ARRANGEMENT

[75] Inventors: Michael Pomper, Schliersee; Martin Geiger, Furth, both of Fed. Rep. of Germany

[73] Assignee: Siemens Aktiengesellschaft, Munich, Fed. Rep. of Germany

[21] Appl. No.: 423,407
[22] PCT Filed: Jan. 25, 1988
[86] PCT No.: PCT/DE88/00035
§ 371 Date: Aug. 25, 1989
§ 102(e) Date: Aug. 25, 1989
[87] PCT Pub. No.: WO88/06795
PCT Pub. Date: Sep. 7, 1988

[30] Foreign Application Priority Data
Feb. 27, 1987 [DE] Fed. Rep. of Germany ....... 3706476

[51] Int. Cl.[5] ............................................. G11C 13/00
[52] U.S. Cl. ................................... 365/104; 365/222
[58] Field of Search ................. 365/104, 222, 189.01, 365/189.04, 189.08, 230.01

[56] References Cited
FOREIGN PATENT DOCUMENTS
0186720 7/1986 European Pat. Off. .
58-141497 8/1983 Japan .

OTHER PUBLICATIONS
"A 240K Transistr CMOS Array with Flexible Allocation of Memory & Channels" Hiromas Takahashi, et al, IEEE Journal of Solid State Circuits, SC-20 (1985) Oct. No. 5, New York U.S.A. pp. 1012-1017.
"Integrierte MOS-Schaltungen", K. Horninger, H. Weiss, Halbelektronik 14, springer-Verlag 1982, pp. 227-236, referring only to pp. 232-233.

Primary Examiner—Terrell W. Fears
Attorney, Agent, or Firm—Hill, Van Santen, Steadman & Simpson

[57] ABSTRACT

Basic cells (GZ) that are composed of at least three p-channel transistors (TP) and of three n-channel transistors (TN) are employed for constructing a read-only memory. Only the outwardly disposed transistors (TP1, TP2) or, respectively, TN1, TN2) are employed for storing the information, whereas the inwardly disposed transistors (TN3, TP3) are not used. An information is stored in that the gate electrode (G) of one transistor (TP, TN) is connected to a word line (W), the drain electrode is connected to a bit line and the source electrode is connected to a fixed supply voltage (VDD, VSS) or is not connected thereto. The layout of the basic cell (GZ) is executed such that the gate terminals ensue in the inner region of the basic cell and the word lines (W) and bit lines (B) are conducted over the basic cell perpendicularly relative to one another. Read-only memories of arbitrary size can be realized by joining such basic cells in rows and columns.

12 Claims, 7 Drawing Sheets

READ-ONLY MEMORY FOR A GATE ARRAY ARRANGEMENT

BACKGROUND OF THE INVENTION

The invention is directed to a read-only memory for a gate array arrangement upon employment of basic cells that contain at least one n-channel and p-channel transistor.

Gate array arrangements are known (for example, Hitachi review, Vol. 33, 1984, No. 5, Pages 261-26). In such gate array arrangements, cell regions or cells are provided in a defined arrangement on a chip, basic cells being realized thereon. The basic cells are composed of n-channel and p-channel transistors that are arranged in the cell regions. The basic cell can be specified for the realization of a basic function by connecting the n-channel transistors and p-channel transistors per basic cell and, for example, it can be lent a logical function or a memory function.

The individual basic cells in the gate array arrangement must be connected to one another for setting functions. This then occurs via wiring channels that are conducted past between the lines of basic cells or over lines of basic cells.

The realization of memories having differing capacity was previously achieved in various ways. Bistable circuits were employed for storing structures having low capacity. These are composed of a plurality of gates and therefore require comparatively many basic cells of a gate array for storing an information unit. High-capacity memories were realized in that a memory having block-defined capacity designed as a general cell was integrated in the region of the chip. This led thereto that the capacity of a memory can be selected only in steps of the memory capacity of this general cell (also referred to as macrocell). Finally, the space requirement for such memories was relatively high since wiring channels had to be arranged between the lines of basic cells.

Read-only memories upon employment of MOS transistors are known (for example, H. Weiss, K. Horninger, Integrierte MOS-Schaltungen, Halbelektronik 14, Springer-Verlag 1982, Pages 232,233). For storing an information unit of the one type, for example "1", a MOS transistor has its controlled path arranged between a supply potential and a bit line and has its gate electrode connected to a word line. For storing an information unit of the other type, for example, "0", no MOS transistor is arranged at the intersections between bit line and word line. It does not derive from the reference, however, how a read-only memory of this principle can be realized in gate array arrangements upon employment of given basic cells.

SUMMARY OF THE INVENTION

The object underlying the invention is comprised in specifying a read-only memory for gate array arrangements whose capacity can be adapted to the respective need and thereby employs basic cells that are likewise employable for the realization of logic functions or for the realization of other basic functions.

In a read-only memory of the species initially recited, this object is achieved by the features of the characterizing part of patent claim 1.

A basic cell composed of at least six transistors, namely three n-channel transistors and three p-channel transistors, is employed. Four bit lines and two word lines can then be conducted over a basic cell and four bits can be stored upon employment of respectively two n-channel transistors and two p-channel transistors. The programming ensues by contacting the drain electrodes of the transistors with a bit line, the gate electrodes with a word line and the source electrodes with a supply potential. This arrangement guarantees that none of the storage transistors must be operated in source follower mode.

In another embodiment, two transistors are utilized per bit to be stored, namely, a respective p-channel and a respective n-channel transistor. Two bits can then be stored per basic cell.

The basic cell is preferably realized such that three p-channel transistors are arranged in a first region and three n-channel transistors are arranged in a second region lying adjacent to the first region. The gate electrodes thereby proceed parallel to one another and the controlled paths of the p-channel transistors or, respectively, of the n-channel transistors lie in series. The gate terminals of the gate electrodes are arranged between the two regions or lie at the inner edges of the two regions. The supply lines, by contrast, are arranged at the outer edges of the two regions. The gate electrodes of the p-channel transistor lying in the center and of the n-channel transistor lying in the center are connected to one another. Given a basic cell executed in such fashion, only the two outwardly disposed n-channel transistors or, respectively, p-channel transistors are used for storing information.

Other developments of the invention derive from the subclaims.

BRIEF DESCRIPTION OF THE DRAWINGS

The invention shall be set forth in greater detail with reference to exemplary embodiments that are shown in the FIGS. Shown are.

DESCRIPTION OF THE PREFERRED EMBODIMENT

Figure 1:
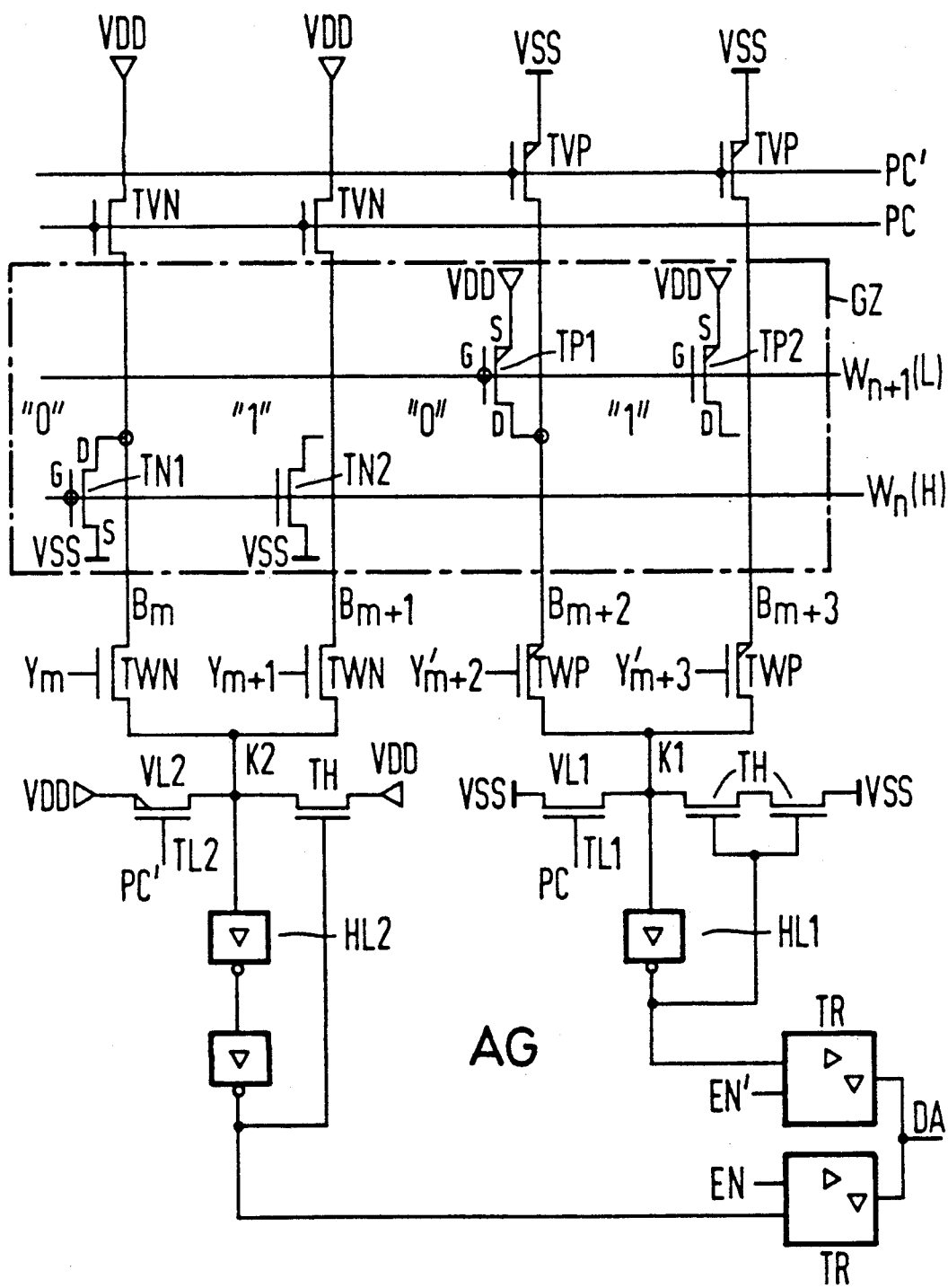
FIG. 1 a first exemplary embodiment wherein four information units are stored per basic cell, comprising output circuit.

FIG. 1 yields a first exemplary embodiment upon employment of a basic cell GZ and of an output circuit AG via which bit lines B are connected to a data line DA. The basic cell GZ comprises two p-channel transistors TP1 and TP2 and two n-channel transistors TN1 and TN2. These transistors are used for storing information units, for example, binary "1" and "0". The output circuit contains pre-charging and holding circuits VL, HL and tristate circuits TR.

The bit lines B are connected to a supply potential via pre-charging transistors TV. The bit lines Bm+2, Bm+3 to which p-channel transistors TP are connectible are thereby connected via a p-channel pre-charging transistor TVP to a supply potential VSS, whereas the bit lines Bm, Bm+1 to which n-channel transistors TN are connectible are connected via a n-channel pre-charging transistors TVN to a different supply potential VDD.

Selection lines W, the word lines, proceed over the basic cell GZ perpendicular to the bit lines B. The gate electrodes of the transistors TP, TN employed for storing are connectible with these word lines.

The P-channel transistors TP are connected to the word line $W_{n+1}$ and n-channel transistors TN are connected to the word line $W_n$. For reading an information out, a lower potential is applied to the word line $W_{n+1}$ and a higher potential is applied to the word line $W_n$, i.e. the word line $W_{n+1}$ is low-active and the word line $W_n$ is high-active.

In the exemplary embodiment of FIG. 1, a "0" is stored when the gate electrode of a p-channel transistor TP or of an n-channel transistor TN is connected to the allocated word line W and the drain electrode of the transistors is connected to the allocated bit line B. Conversely, a "1" is stored when there is no contacting of a transistor TP or, respectively, TN with the allocated word line or, respectively, bit line.

For reading an information out, the bit lines B are first pre-charged. This ensues with the assistance of the precharging transistors TV to which a pre-charging signal PC for the n-channel transistors and an inverted signal PC' for the p-channel transistors is applied. The pre-charging transistors TV are thereby activated. The bit-lines B to which p-channel storing transistors are connected are recharged to a voltage VSS plus UTP, whereby UT is the threshold voltage of the p-channel transistors. Correspondingly, the bit lines to which n-channel storing transistors TN are connected are re-charged to the voltage VDD-UTN, whereby UTN is the threshold voltage of the n-channel transistors. Subsequently, a word line W is driven with a selection signal and, when a "0" is stored, the allocated bit line is recharged toward the supply potential VDD or, respectively, VSS. For example; the p-channel transistor TP1 stores a binary "0". When it is driven by a signal on the word line WN+1, then it recharges the bit line Bn+2 toward VDD. The corresponding case applies for the n-channel transistor TN1 that discharges the bit line Bn toward VSS. In this operating mode, the storing transistors TP and TN are not operated in the source follower mode.

When, by contrast, a binary "1" is read out, then the storing transistor TP or, respectively, TN is not contacted and the bit line remains at the potential to which it had been pre-charged by the pre-charging transistors TV.

The read-out of the potential on the bit lines B ensues via selection transistors TWP or, respectively, TWN. A bit line selection signal Y is applied to these selection signals, the transistors being activated as a result thereof. Given bit lines to which p-channel storing transistors TP are connected, p-channel transistors are employed as selection transistors; given bit lines to which n-channel storing transistors TN are connected, n-channel selection transistors TWN are employed.

The p-channel selection transistors TWP are interconnected to form a group in a node K1. The analogous case applies for the n-channel selection transistors TWN; they are interconnected in a node K2. A pre-charging and holding circuit VL1, HL1, is connected to the node K1 and a precharging circuit VL2 and holding circuit HL2 is connected to the node K2. The node K1, K2 is pre-charged to the potential VSS or VDD with the pre-charging circuit VL1, VL2, namely with the assistance of a pre-charging transistor TL1, TL2 that is likewise drive with the pre-charging signal PC, PC'. Corresponding to the potential on one of the bit lines, the node K1, K2 is re-charged or is not re-charged after the drive of the selection transistors TW. The node K1, K2 thus assumes the potential on the read-out bit line. This potential is maintained with the assistance of the holding circuit HL1, HL2. This is especially important when a "1" is read out. The transistors TH of the holding circuit HL1, HL2 are then activated and apply a fixed potential VSS or, respectively, VDD minus UTN to the node K1, or, respectively, K2.

The output circuit containing the selection transistors TW, the pre-charging circuit VL and the holding circuit HL further comprises tristate driver circuits TR via which the signal at the output of the holding circuit HL is transmitted to the data line DA. The tristate circuit TR is selected with the assistance of a decoder signal EN.

When, for example, an information is to be read out that is stored in the p-channel storing transistor TP2, then the pre-charging signal PC' is applied and, thus, the bit line Bn+3 is pre-charged to VSS+ UTP; correspondingly, the node K1 is re-charged to VSS via the transistor TL1. After this recharging, the pre-charging signal PC disappears and the word line Wn+1 is driven. Since the transistor TP2 is not contacted with the bit line Bn+3, the potential on the bit line does not change. By applying an inverted selection signal Y', the selection transistor TWP becomes activated and connects the bit line Bm+3 to the node K1. Slight charge sharing between the bit line Bm+3 (potential VSS+ UTP) and the node K1 (potential VSS) does not lead to the triggering of the following inverter since the transistors of the holding circuit HL1 are activated. The read-out information is transmitted to the data line via the tristate circuit TR by applying the decoder signal EN.

When, by contrast, an information is to be read out from the p-channel transistor TP1, then the bit line Bm+2 that is initially pre-charged to VSS plus UTP is re-charged toward VDD by the transistor TP1. The potential thereby arising is applied to the node K1 via the selection transistor after the application of the bit line selection signal Y' and likewise leads to the re-charging thereof. The potential at the node K1 is then transmitted to the data line DA via the tristate circuit TR after the application of the decoder signal EN.

In FIG. 1, VDD references a first operating potential, VSS references a second operating potential, PC references the pre-charging signal, PC' references the inverted pre-charging signal, Y references the bit line selection signal, Y' references the inverted bit line selection signal, EN references the decoder output signal and EN' references the inverted decoder output signal. A contacting between the gate electrode of a storing transistor with a word line is present when the gate electrode is marked with a small circle. The analogous case applies for the drain electrode of the storing transistors. The gate electrode is referenced G, the source electrode is referenced S and the drain electrode D.

Figure 2:
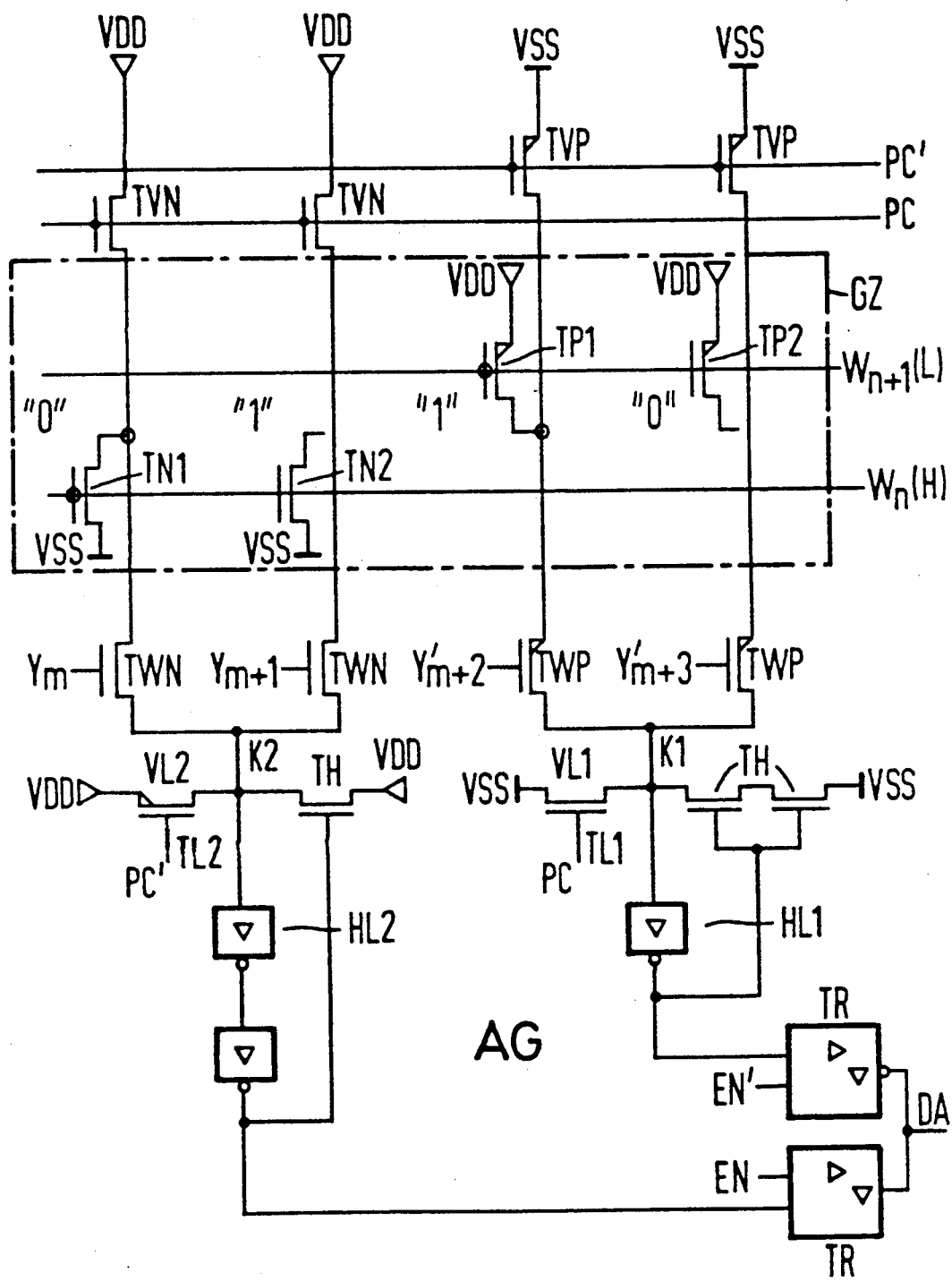
FIG. 2 a second exemplary embodiment.

The exemplary embodiment of FIG. 2 differs from that of FIG. 1 only in that the allocation of the p-channel storing transistors to the information to be stored is inverted. Now, a contacted p-channel storing transistors, for example, TP1, stores a "1"; a non-contacted p-channel, storing transistor, for example TP2, stores a "0". In comparison to the exemplary embodiment of FIG. 1, positive logic is employed in the p-channel storing transistors TP. Accordingly, the allocated tri-state circuit TR is executed inverted.

Figure 3:
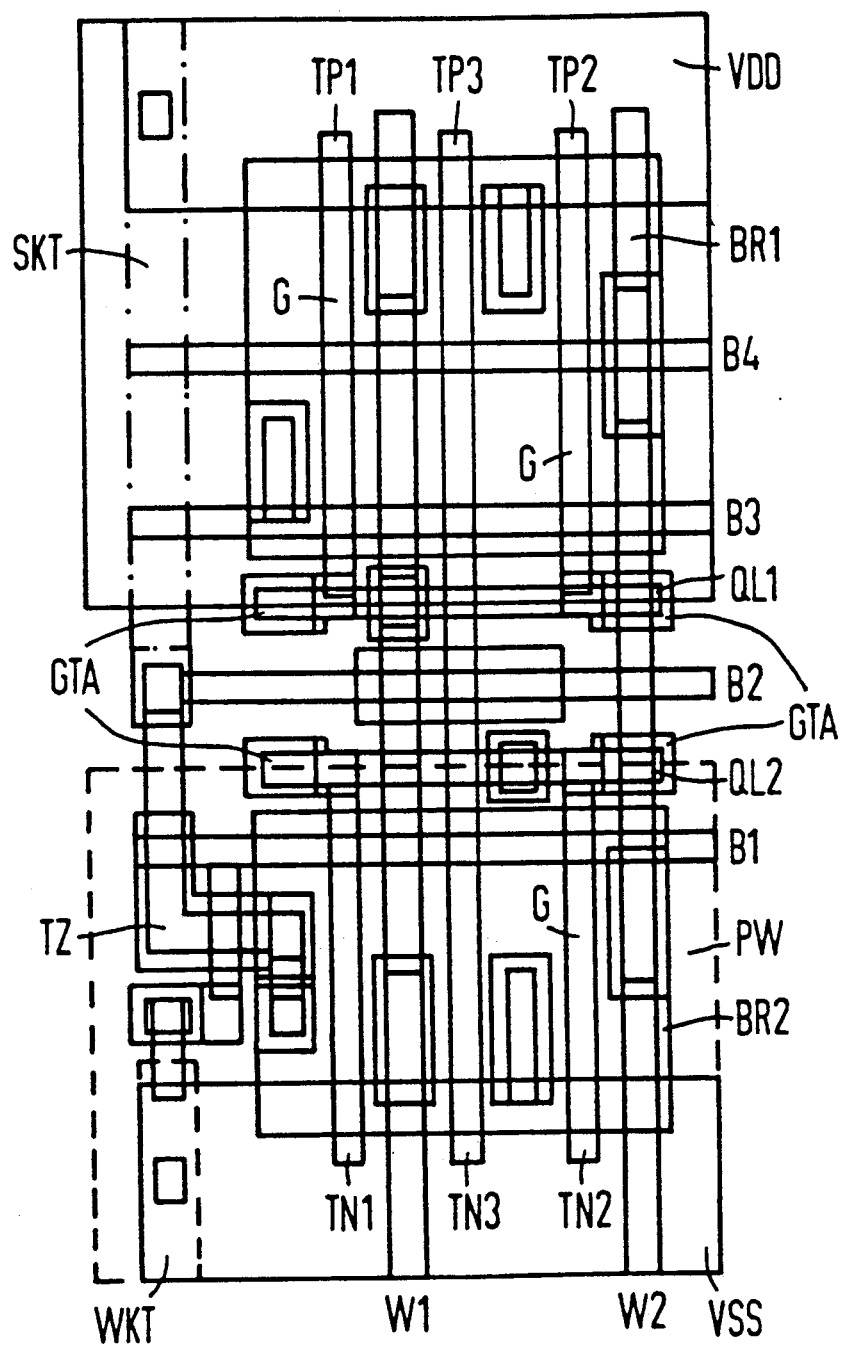
FIG. 3 a layout of the basic cell comprising connections for storing four information units.

The layout of a basic cell GZ comprising three p-channel transistors TP and three n-channel transistors TN and an additional n-channel transistor TZ is shown in FIG. 3. The p-channel transistors TP1 through TP3 are arranged in a first region BR1. A second region BR2 in which the n-channel transistors TN1 through TN3 lie is adjacent to the first region BR1. The p-channel transistors TP and the n-channel transistors TN have their controlled paths lying in series; the gate electrodes G are arranged parallel to one another. Their gate terminals GTA are arranged between the two regions BR1 and BR2 or lie at the inner edges of these regions. The one supply potential VDD is arranged at the outer edge of the first region BR1 and the other supply potential VSS is arranged at the outer edge of the other region BR2. The n-channel transistors TN lie in a p-well PW. Further, a well contact WKD and a substrate contact SKT are provided.

The basic cell GZ also contains an additional n-channel transistor TZ that lies in the proximity of the second supply potential VSS adjacent to the second region BR2. The gate electrodes of the p-channel transistor TP3 and of the n-channel transistor TN3 are connected to one another.

The two p-channel transistors TP1 and TP2 and the two n-channel transistors TN1 and TN2 of the basic cell are employed for the realization of a read-only memory. Corresponding to the exemplary embodiment of FIG. 1 and of FIG. 2, four information can thus be stored. To that end, contactings of the transistor electrodes to the word line W and to the bit line must be carried out or not be carried out corresponding to FIG. 1 or FIG. 2. The word lines W1 and W2 thereby proceed over both regions BR1 and BR2; namely, the word line W1 lies between the transistors TP1 or, respectively, TN1 and TP3 or, respectively, TN3; the word line W2 is conducted adjacent to the gate electrode of the transistor TP2 and TN2 over the diffusion region at the edge of the regions BR1 and BR2. A shunt line UL1 that runs along at the inside edge of the region BR1 is provided for contacting the word line W1 to the gate electrodes G of the p-channel transistors TP1 and TP2. A second shunt line UL2 that runs along at the inside edge of the second region BR2 is provided for contacting the word line W2 to the n-channel transistors TN1 and TN2.

The bit lines B1 through B4 proceed perpendicularly relative to the word lines W, whereby every bit line B can be contacted only to one of the transistors of the basic cell GZ. The bit line B1 is contactible to the drain electrode of the n-channel transistors TN2; the bit line B2 is contactible to the drain electrode of the n-channel transistors TN1; the bit line B3 is contactible to the drain electrode of the p-channel transistors TP1; and the bit line B4 is contactible to the drain electrode of the p-channel transistor TP2. The layout of the transistors of the basic cell is executed such that the bit lines B3 and B4 proceed over the region BR1, the bit line B1 proceeds over the region BR2, and the bit line B2 proceeds over the space between the two region BR1 and BR2. The connection of the p-channel transistors TP1 and TP2 to the supply potential VDD ensues between the gate electrodes of the transistors TP1 and TP3 or, respectively, TP2 and TP3 and, correspondingly, the connection of the n-channel transistors TN1 and TN2 to the supply potential VSS proceeds between the gate electrodes of the transistors TN1 and TN3 or, respectively, TN2 and TN3.

The additional transistor TZ is not utilized for storing information in the read-only memory; for example, it can be deactivated and can have its gate electrode connected to the supply potential VSS. However, it can be employed as transistor TH in the holding circuits. To that end, it is beneficial that it has a small channel width. The transistors TT, TN cannot be used for that purpose because, for example, the p-channel transistor TR1 could not trigger the node K1 that is pre-charged to VSS upon read-out of a "1" from TP1. The node K1, namely, is held at VSS by the holding circuit HL1 and must be triggered by TP1.

Figure 4:
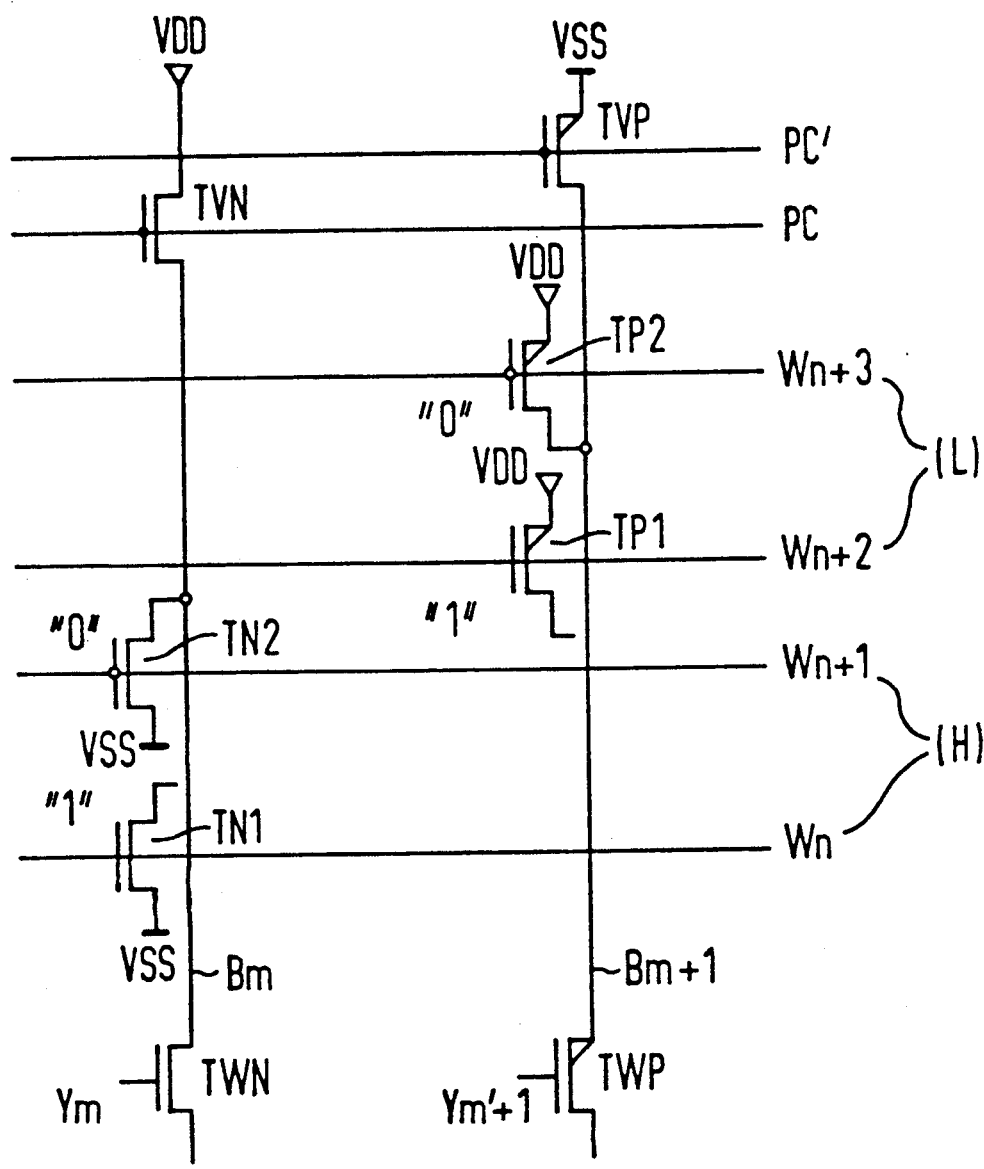
FIG. 4 a third exemplary embodiment of the invention wherein two information units are stored per basic cell per bit line.

FIG. 4 shows a further exemplary embodiment of the read-only memory upon employment of the basic cells of FIG. 3. The difference compared to the embodiments of FIG. 2 and of FIG. 1 is comprised therein that four word lines Wn through Wn+3 and two bit lines Bm through Bm+1 are now used per basic cell. The two p-channel translators TP1 and TP2 that are used for storing now lie at one line, namely, the bit line Bm+1; correspondingly, the two n-channel transistors TN1 and TN2 used for storing lie at one bit line Bm. The storing of the information ensues in accord with FIG. 1 and the operating mode is also comparable to that set forth with reference thereto.

Figure 5:
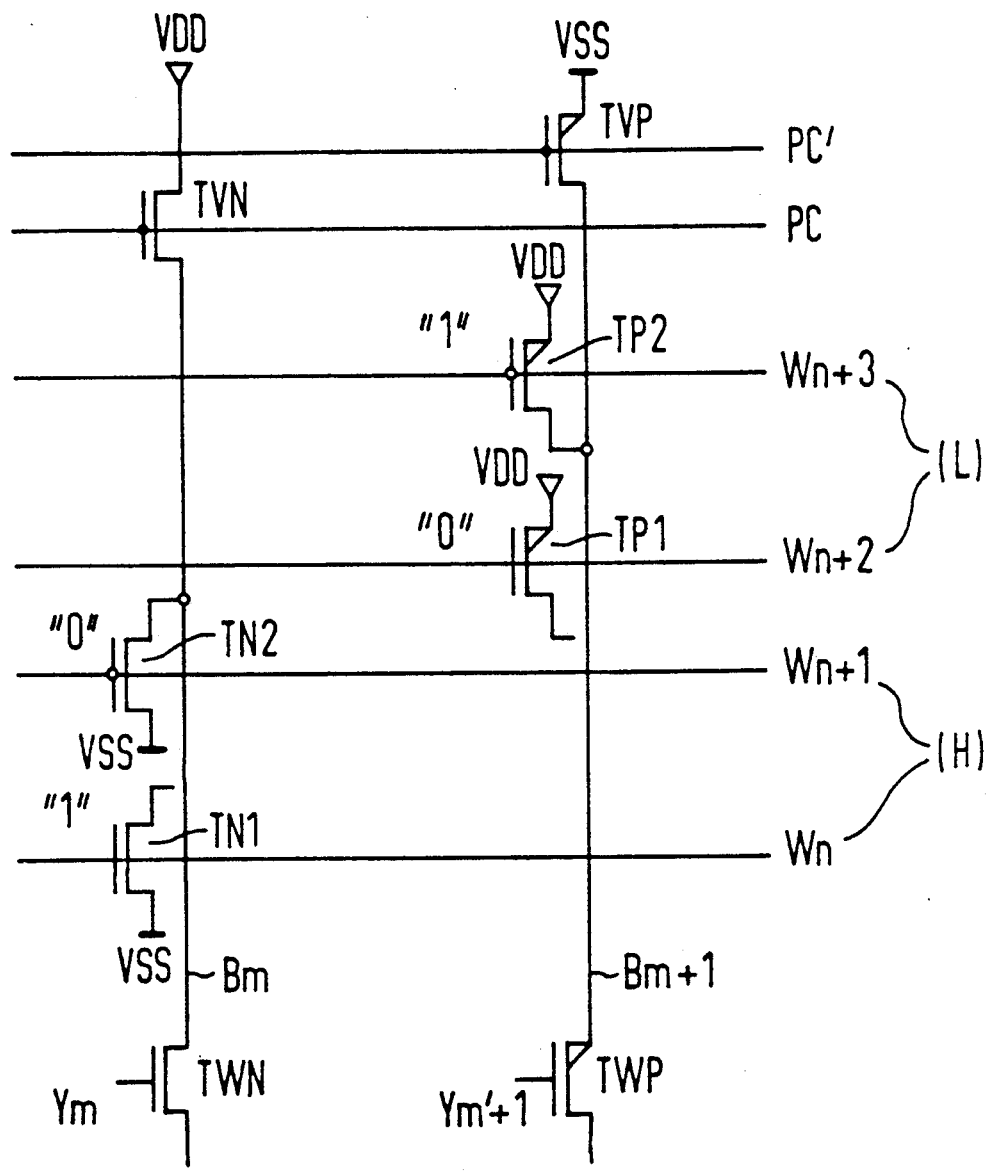
FIG. 5 a modified allocation of the information units to the p-channel transistors.

FIG. 5 corresponds to FIG. 2 with the difference that four word lines Wn through Wn+3 and only two bit lines Bm and Bm+1 are again provided here. The pre-charging transistors TV and the selection transistors TW are operated in accord with FIG. 1 and FIG. 2. The analogous case applies to the output circuit AG that is not shown in FIGS. 4 and 5.

Figure 6:
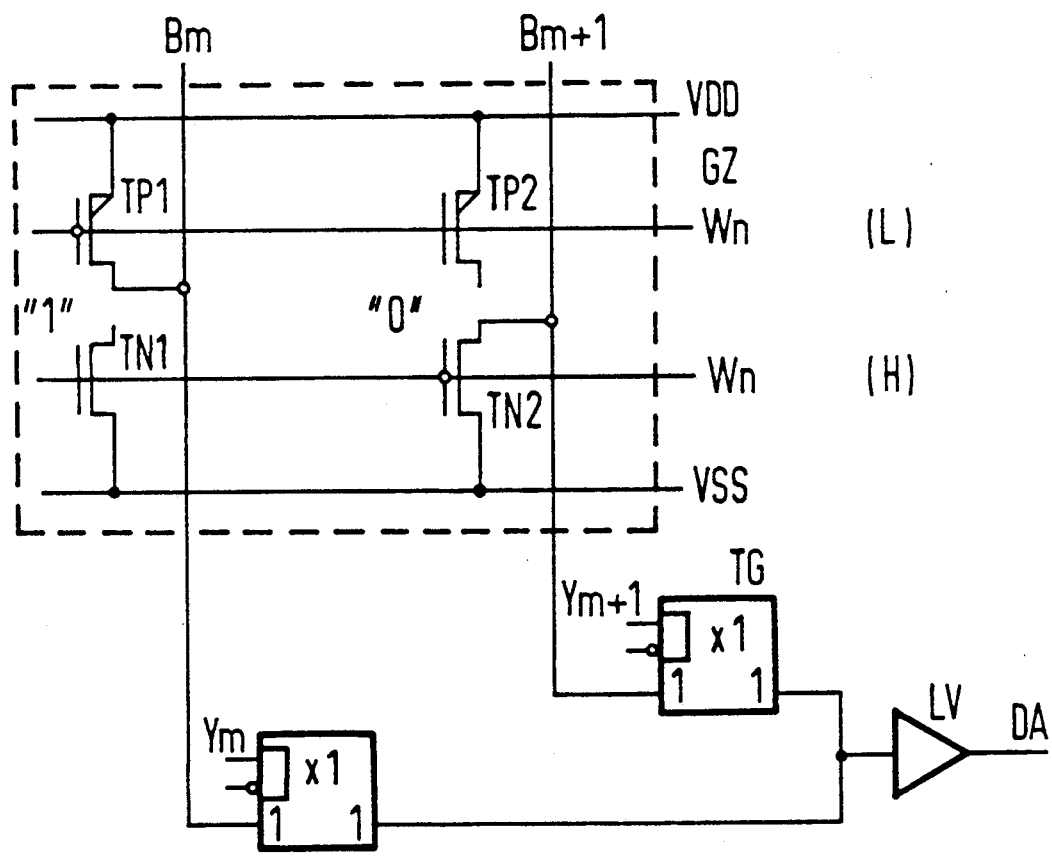
FIG. 6 an exemplary embodiment wherein two transistors are employed for storing an information unit and wherein the read-only memory works without pre-charging of the bit lines.

A read-only memory wherein work is carried out without a pre-charging can be derived from FIG. 6. It has the advantage that the cycle time is identical to the read time as a consequence of the pre-charging of the bit lines Bm, Bm+1 that is not required here. A disadvantage of this circuit is that only two bits can be stored in a basic cell since a respective p-channel transistor and a respective n-channel transistor are required for a bit. The programming again ensues by the contacting of the corresponding gate electrodes and drain electrodes. The information is written onto a data line DA via the read amplifier LV via two transfer gates TG that are driven by an address decoder. For example, the n-channel transistor TN2 is contacted to a word line Wn and to a bit line Bm+1 for storing a "0", whereas the p-channel transistor TP2 is not contacted. For storing a "1", by contrast, the p-channel transistor TP1 is contacted to the bit line Bm and to the word line Wn, whereas the n-channel transistor Tn is not contacted. One of the bit lines Bm or Bm+1 is selected with the assistance of the bit line selection signal Ym or Ym+1 and, given the additional presence of a signal from the address decoder, is connected through to the read amplifier LV.

Figure 7:
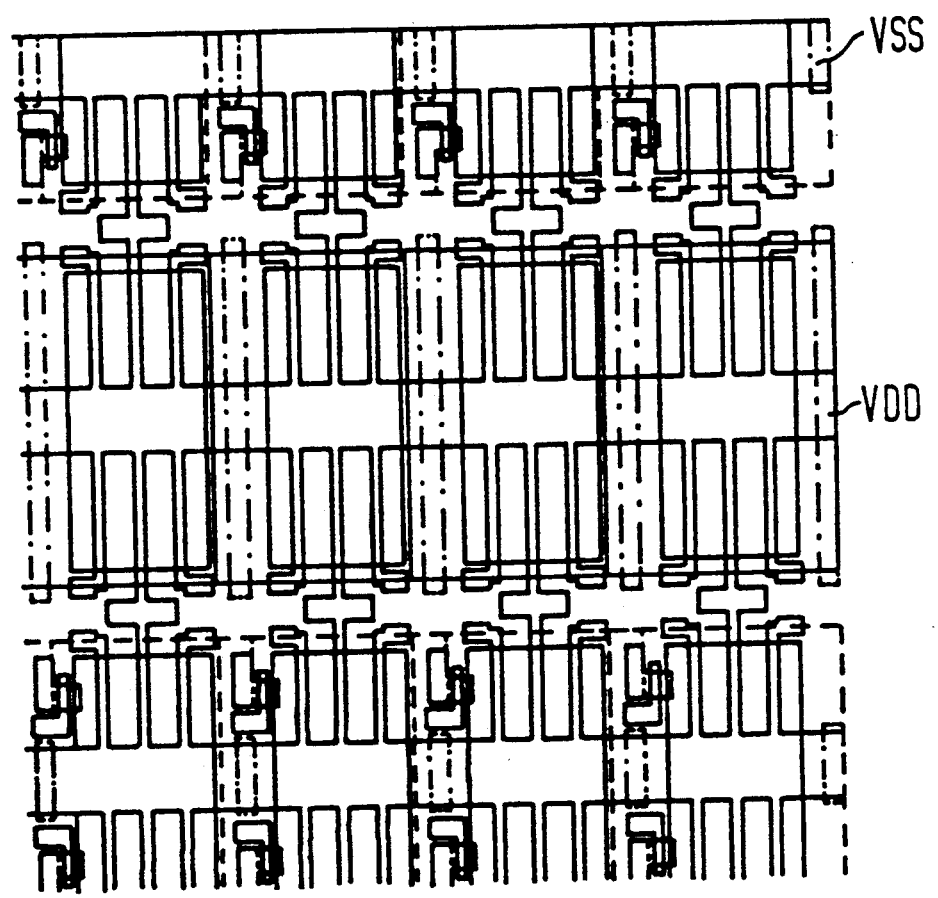
FIG. 7 a portion of a gate array arrangement comprising basic cells according to FIG. 3, but without wiring.

For realizing a read-only memory composed of basic cells GZ, these are arranged in rows and columns, corresponding to a portion of FIG. 7. Since every basic cell GZ can store four information or, in accord with FIG.

6, two information, a read-only memory of arbitrary size can be realized with a corresponding plurality of basic cells. The output circuit and pre-charging transistors required for the operation of the read-only memory can likewise be realized with the assistance of the basic cells GZ. FIG. 7 thereby only shows the arrangement of the basic cells GZ, but not their wiring.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. Read-only memory for a gate array arrangement having basic cells that contain at least one n-channel transistor and one p-channel transistor, comprising:
   a) for each basic cell of the gate array arrangement,
      a1) the p-channel transistors each have their gate electrode connectible to a first selection line that is connected to a first potential for the selection of the p-channel transistors, have their source electrode connected to a first supply potential and have their drain electrode connectible to a bit line,
      a2) the n-channel transistors have their gate electrode connectible to a second selection line that is connected to a second potential for the selection of the n-channel transistors, have their source electrode connected to a second supply potential and have their drain electrode connectible respectively to a bit line of a plurality of bit lines for storing information;
   b) an output circuit connecting the plurality of bit lines to a data line,
      b1) said output circuit having, per bit line, a selection transistor of a plurality of selection transistors or respectively, that is driven by a bit line selection signal connected to the bit line and having the same conductivity type as the associated n-channel or p-channel transistors employed for information storing, said selection transistor being connected to selection transistors of the same conductivity type in groups in a node of the output circuit,
      b2) said output circuit containing a pre-charging circuit and a holding circuit per group of selection transistors of one conductivity type, said output circuit being connected to the node and, before the drive of the selection transistors by a bit line selection signal, this node is charged to the supply potential, or respectively, used for the pre-charging of the bit line and holding the information potential at the node after the read-out of the information.

2. Read-only memory according to claim 1, wherein the bit lines to which the p-channel transistors are connectible are connected to the second supply potential via a p-channel transistor that is driven by a first pre-charging signal.

3. Read-only memory according to claim 2, wherein the bit lines to which the n-channel transistors are connectible are connected to the first supply potential via a n-channel transistor driven by a second pre-charging signal.

4. Read-only memory according to claim 3, wherein the pre-charging circuit comprises a transistor driven by the pre-charging signal, said transistor re-charging the node to a potential to which the allocated bit line is pre-charged.

5. Read-only memory according to claim 4, wherein the output circuit contains a tristate circuit that connects the output of the holding circuit to the data line.

6. Read-only memory according to claim 3, wherein the n-channel transistors are connected to the allocated bit line and to the allocated selection line for storing the information of the one type ("0") and the p-channel transistors are connected to the allocated bit line and to the allocated selection line for storing the information of the other type ("1").

7. Read-only memory according to claim 6, wherein the basic cell contains respectively three p-channel transistors and three n-channel transistors whose controlled paths are respectively connected in series; and wherein the information are stored in outer transistors thereof.

8. Read-only memory according to claim 7, wherein the basic cell is composed of three p-channel transistors arranged in a first region, of three n-channel transistors arranged in a second region lying adjacent to said first region, and of an additional n-channel transistor lying next to said second region; wherein the terminals for the gate electrodes of the n-channel and p-channel transistors lie between the first and second regions or at the inside edges thereof and the line of the first supply potential proceeds at the outer edge of the first region, and the line for the second supply potential proceeds at the outer edge of the second region; and wherein the additional n-channel transistor has its gate terminal lying adjacent to the line for the second potential.

9. Read-only memory according to claim 8, wherein a first selection line proceeds between the gate electrodes of the one outer transistor and the middle transistors; wherein a second selection line proceeds next to the gate electrode of the other, outwardly disposed transistor at the edge of the first and second regions; and wherein the contacting of the first selection line to the gate electrodes of the p-channel transistors ensues via a shunt line connected at the inner edge of the first region and the contacting to the gate electrodes of the n-channel transistors ensues via a second shunt line proceeding at the inner edge of the second region; wherein two bit lines proceed transversely relative to the word lines over the first region for contacting the drain electrodes of the p-channel transistors in the first region; wherein a bit line proceeds transversely relative to the selection lines over the second region adjacent to the inner edge thereof and a second bit line proceeds transversely relative to the selection lines between the first and second region for contacting the drain electrodes of the n-channel transistors in the second region.

10. Read-only memory according to claim 9, wherein the contacting of the drain terminals of the n-channel and p-channel transistors to the bit lines ensues at the edge of the first and second regions, whereas the contacting of the source terminals to the first and second supply potentials ensues in the space between the gate electrodes of the outer transistors and the middle transistors.

11. Read-only memory according to claim 8, wherein the gate terminal of the additional n-channel transistors is connected to the second supply potential.

12. Read-only memory according to claim 11, wherein the transistors of the holding circuits are composed of additional transistors of the basic cell.

* * * * *